(12) United States Patent
Baek et al.

(10) Patent No.: US 6,692,980 B2
(45) Date of Patent: Feb. 17, 2004

(54) METHOD FOR FABRICATING MONOLITHIC INTEGRATED SEMICONDUCTOR PHOTONIC DEVICE

(75) Inventors: Yongsoon Baek, Daejon (KR); Jungwoo Park, Seoul (KR); Sungbock Kim, Daejon (KR); Kwangryong Oh, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 10/188,468

(22) Filed: Jul. 2, 2002

(65) Prior Publication Data

US 2003/0143769 A1 Jul. 31, 2003

(30) Foreign Application Priority Data

Jan. 29, 2002 (KR) .......................... 2002-5204

(51) Int. Cl.[7] .............................................. H01L 21/00
(52) U.S. Cl. ............................. 438/29; 438/30; 438/31
(58) Field of Search ............................ 438/29, 30, 31, 438/22, 48

(56) References Cited

U.S. PATENT DOCUMENTS

| | | | |
|---|---|---|---|
| 5,862,168 A | * | 1/1999 | Schilling et al. .............. 372/50 |
| 6,025,207 A | | 2/2000 | Mersali et al. |
| 6,194,240 B1 | * | 2/2001 | Chiu et al. ..................... 438/31 |
| 6,309,904 B1 | * | 10/2001 | Pommereau et al. .......... 438/31 |
| 2002/0110170 A1 | * | 8/2002 | Bouadma ..................... 372/43 |

OTHER PUBLICATIONS

IEEE Photonics Technology Letters, vol. 10, No. 4, Apr. 4, 1998, pp. 510–512.

First 20Gbit/s all optical wavelength conversion withan integrated active–passive Mach–Zehnder Interferometer and comparison with the similar all–active device, 3 pages.

* cited by examiner

Primary Examiner—Michael S. Lebentritt
Assistant Examiner—Brad Smith
(74) Attorney, Agent, or Firm—Blakely, Sokoloff, Taylor & Zafman

(57) ABSTRACT

A method of fabricating a monolithic integrated semiconductor photonic device is provided. In this method, it is possible to remarkably reduce an optical loss in a passive waveguide by forming a non-doped clad layer around a passive layer. Thus, the passive waveguide can be effectively coupled with an active waveguide. Further, a current confinement layer is formed around an active layer, using the non-doped clad layer. Therefore, an expensive tool such as an ion implanter is not required, thereby decreasing manufacturing costs.

23 Claims, 14 Drawing Sheets

METHOD FOR FABRICATING MONOLITHIC INTEGRATED SEMICONDUCTOR PHOTONIC DEVICE

BACKGROUND OF THE INVENTION

1. Field of the Invention

The present invention relates to a method for fabricating a semiconductor photonic device, and more particularly, to a method for fabricating an integrated semiconductor photonic device in which an active waveguide and a passive waveguide are combined with each other on a substrate.

2. Description of the Related Art

When fabricating a semiconductor photonic device, a current confinement layer is fabricated generally by a method of forming a p/n/p current confinement layer or a method of forming a current confinement layer of buried ridge strip (BRS) type. Using the method of forming a p/n/p current confinement layer, it is possible to effectively block electric current. However, this method has the disadvantage of there being slight variations in the structure of the resulting semiconductor photonic devices, especially, when a waveguide of a top and bottom dual structure is manufactured by combining a waveguide with a mode-conversion type passive waveguide. That is, this method is disadvantageous regarding reproducibility, whereas the method of forming a BRS type current confinement layer is profitable regarding reproducibility.

FIGS. 1A through 1D are views explaining a method of forming a BRS type current confinement layer, which is disclosed in U.S. Pat. No. 6,025,207. In detail, a buffer layer 11, a guiding layer 12, an intermediate layer 13 and an active layer 14 are sequentially deposited on a substrate 10. Next, as shown in FIG. 1B, the active layer 14 is patterned in the form of a strip, and portions of the intermediate layer 13, which are exposed due to the patterning of the active layer 14, are also etched. Then, referring to FIG. 1C, resumption of epitaxial growth is used to bury the active layer 14 in the p-type clad layer 16, and then a conductive layer 18 is deposited on the p-type clad layer 16. Thereafter, an ion implantation mask 26 is formed on the conductive layer 18, being aligned with respect to the active layer 14. Next, ions are implanted into the p-type clad layer 16 so as to form ion-implanted regions 17a and 17b at the both sides of the active layer 14. As a result, a current confinement layer, which is defined by a channel C, is formed between the ion-implanted regions 17a and 17b. Then, referring to FIG. 1D, the ion implantation mask 26 is removed to form a contact layer 20 on the conductive layer 18.

The method of forming a BRS type current confinement layer is easy to fabricate a photonic device by performing resumption of epitaxial growth only once. Therefore, this method has reproducibility when semiconductor devices are fabricated. However, this method is not proper in fabricating a monolithic integrated semiconductor photonic device that is integrated with a passive waveguide. Specifically, when fabricating the monolithic integrated semiconductor photonic device, it is very important to effectively combine an active layer with a passive waveguide. However, the method of forming a BRS type current confinement layer requires a p-type clad layer basically, which would result in higher optical losses when the active layer is combined with the passive waveguide. Further, an ion implanter, which is very expensive, is required, thereby increasing manufacturing cost therefor.

To solve these problems, A. Labrousse et al. suggested that a passive waveguide be made in the form of a deep ridge and then coupled with a BRS type active layer, disclosed in their thesis entitled "First 20 Gbit/s All Optical Wavelength Conversion with an Integrated Active-Passive Mach/Zehnder Interferometer and Comparison with the Similar All-Active Device" which was introduced in OAA 2001, OWA2. However, a deep ridge-type passive waveguide has higher optical losses than a buried waveguide. Also, the structure of a deep-ridge-type passive waveguide is very different from that of a buried active waveguide. For this reason, a monolithic integrated semiconductor photonic device has low coupling coefficient at a portion where the deep-ridge-type passive waveguide is combined with the buried active waveguide.

SUMMARY OF THE INVENTION

To solve the above problem, it is an object of the present invention to provide a method of fabricating a monolithic integrated semiconductor photonic device by effectively combining an active waveguide and a passive waveguide with each other, and minimizing a loss of light therein.

To achieve the above object, there is provided a method of fabricating a monolithic integrated semiconductor photonic device that effectively combines an active waveguide and a passive waveguide, and minimizes an optical loss, including: forming an active layer of a strip shape and a passive layer of a strip shape, which is connected directly to the active layer, on a first conductive substrate; forming a non-doped clad layer around the passive layer so as to form a passive waveguide, and a buried ridge strip (BRS) type current confinement layer around the active layer without ion injection; and forming a second conductive current injection layer on the resultant structure having the current confinement layer so as to form an active waveguide coupled to the passive waveguide.

According to the present invention, it is possible to remarkably reduce an optical loss in a passive waveguide by forming a non-doped clad layer around a passive layer. Also, a current confinement layer can be formed around an active layer without implanting ions, so that expensive equipment such as an ion implanter is not required. In addition, the active waveguide can be effectively coupled with the passive waveguide.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1A:
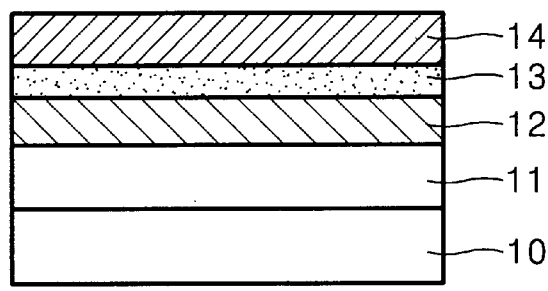
FIGS. 1A through 1D are views for explaining a method of forming a current confinement layer of a conventional buried ridge strip (BRS) type.
Figure 1B:
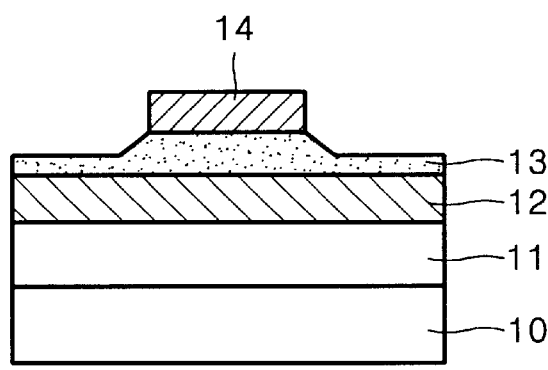
Figure 1C:
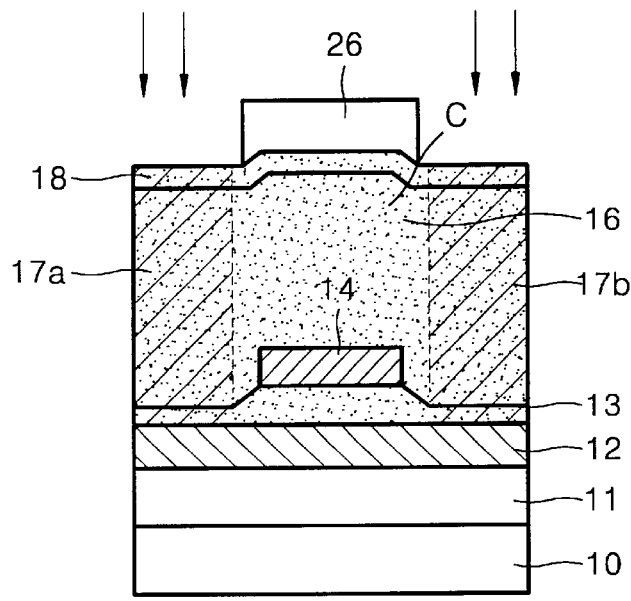
Figure 1D:
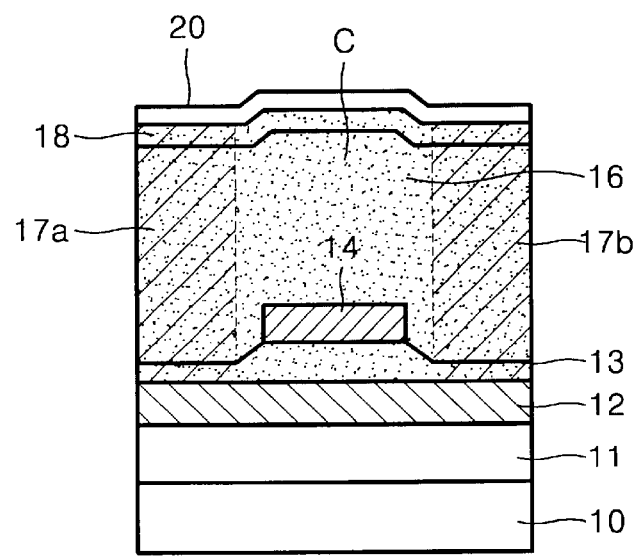
Figure 2A:
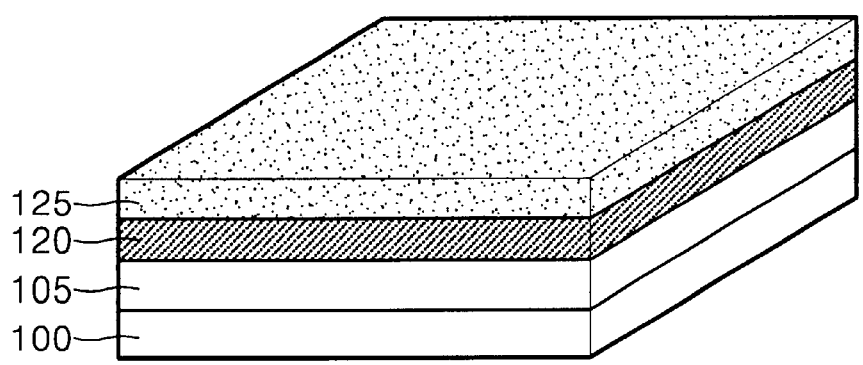
FIGS. 2A through 2K are perspective and cross-sectional views explaining a first embodiment of a method of fabricating a monolithic integrated semiconductor photonic device according to the present invention.
Figure 2B:
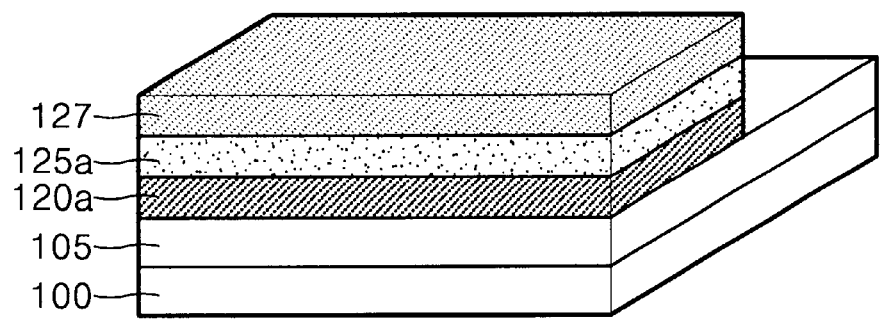
Figure 2C:
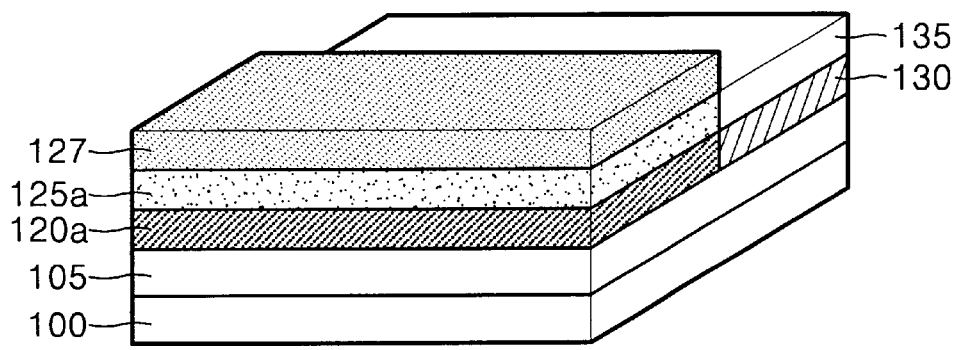
Figure 2D:
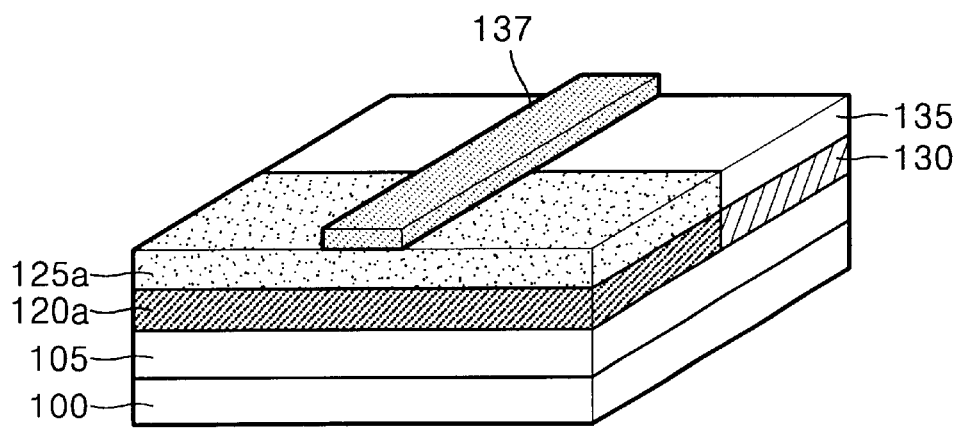
Figure 2E:
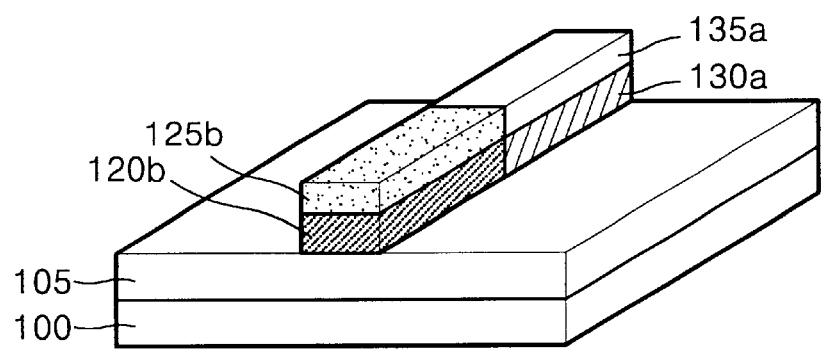
Figure 2F:
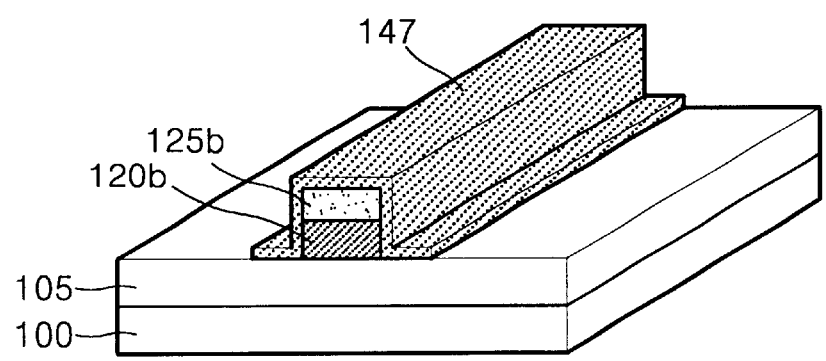
Figure 2G:
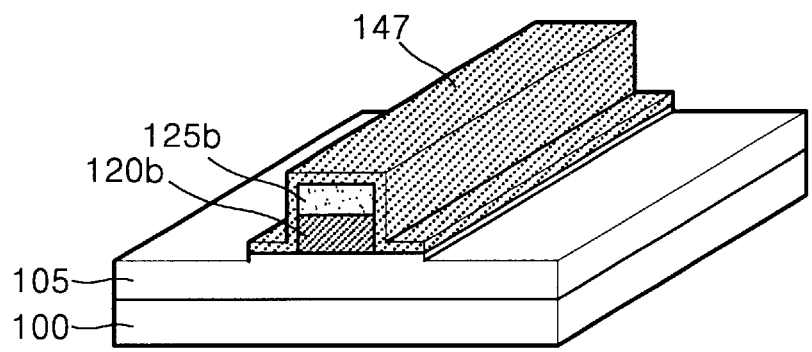
Figure 2H:
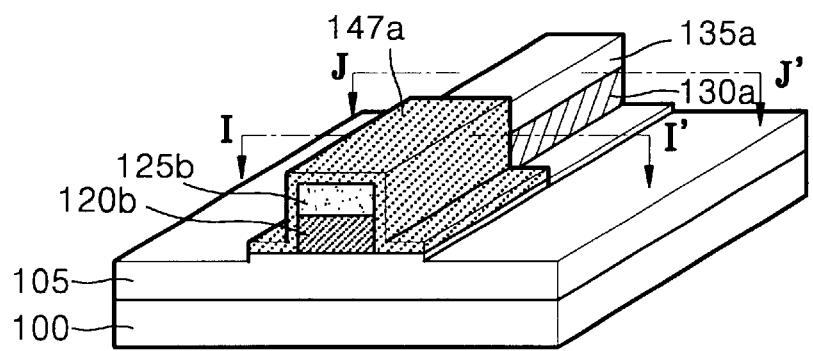
Figure 2I:
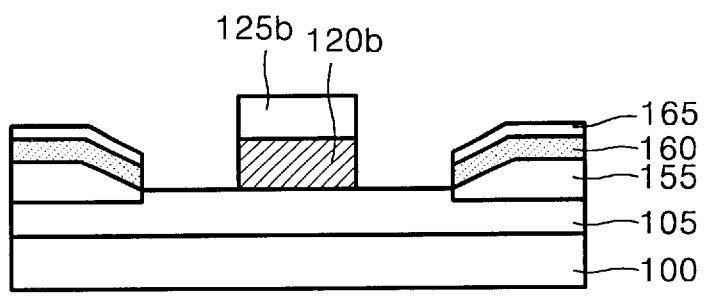
Figure 2J:
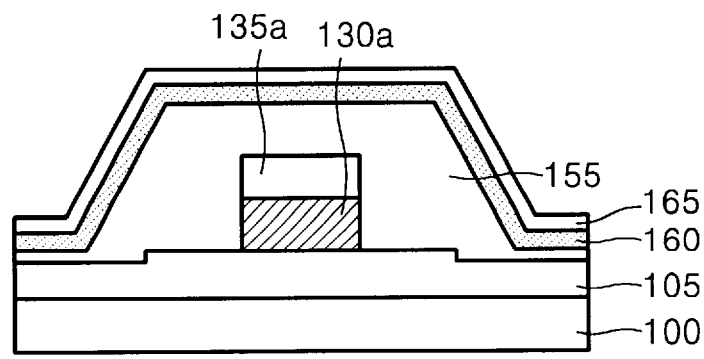

FIGS. 2A through 2K are perspective and cross-sectional views for explaining a method of fabricating a first embodiment of a monolithic integrated semiconductor photonic device according to the present invention. In detail, FIG. 2I is a cross-sectional view of the resultant structure of FIG. 2H, taken along the lines I–I', and FIG. 2J is a cross-sectional view of the resultant structure of FIG. 2H, taken along the lines J–J'.

Referring to FIG. 2A, an n-type buffer layer 105, a first layer 120 for an active layer, and a first protection layer 125 are sequentially deposited on an n-type semiconductor substrate 100. These layers may be formed by metal-organic chemical vapor deposition (MOCVD). Also, the first layer 120 for an active layer may be formed as bulk InGaAsP or multi quantum well (MQW), bulk InGaAsP containing a separate confinement hetero-structure (SCH) or MQW containing SCH. The first protection layer 125 is formed of InP doped with a p-type carrier so that electric current be easily injected into an active layer.

Next, as shown in FIG. 2B, a first mask 127 is formed on the first protection layer 125. Then, portions of the first protection layer 125, and the first layer 120 for an active layer are removed by dry etching or wet etching, using the first mask 127 as an etch mask. As a result, a portion of the top of the buffer layer 105 is exposed to form a first protection layer pattern 125a, and a first pattern 120a for an active layer. The first mask 127 may be formed of a silicon nitride layer, for example.

Referring to FIG. 2C, a second layer 130 for a passive layer is selectively grown on the exposed portion of the buffer layer 105, which is not covered with the first mask 127, to be in contact with the sidewall of the first pattern 120a for an active layer. Then, a second protection layer 135 is grown on the second layer 130 for a passive layer. Here, the second layer 130 for a passive layer functions as a photonic waveguide for inducing the path of progressive light so as to make various functional devices in an integrated semiconductor photonic device. Preferably, the second layer 130 for a passive layer is formed of bulk InGaAsP or MQW having larger energy band gap than progressive light. The second protection layer 135 is formed of non-doped InP so as to reduce an optical loss in a waveguide.

As shown in FIG. 2D, the first mask 127 is removed. Then a strip-type second mask 137 is formed on the first protective pattern 125a and the second protection layer 135, so that an active layer, a protection layer above the active layer, a passive layer connected directly to the active layer and a protection layer above the passive layer form together as a strip. The second mask 137 may be formed of a silicon nitride layer.

Next, referring to FIG. 2E, the first protection layer pattern 125a, the second protection layer 135, the first pattern 120a for an active layer, and the second layer 130 for a passive layer are dry etched using the second mask 137. As a result, a strip-type active layer 120b, a protection layer 125b covering the active layer 120b, a passive layer 130a connected directly to the active layer 120b, and a protection layer 135a covering the passive layer 130a, are formed. After the dry etching, wet etching can be performed to remove any layers damaged during the dry etching. The width of the active layer 120b and the passive layer 130a may be determined in the range of 0.5–1.5 $\mu$m.

Referring to FIG. 2F, a third mask 147 is formed to cover the active layer 120b, the protection layer 125b, the passive layer 130a, and the protection layer 135a. Here, the width of the third mask 147 is wider than those of the active layer 120b and the passive layer 130a, e.g., 3–8 $\mu$m. The third mask 147 is formed of a silicon nitride layer.

Next, as shown in FIG. 2G, a portion of the buffer layer 105 is wet etched or dry etched using the third mask 147 as an etch mask. At this time, the portion of the buffer layer 105 is etched to a depth of 2 $\mu$m so that a current confinement layer can be sufficiently formed during a subsequent process.

Referring to FIGS. 2H through 2J, the third mask 147 is patterned to form a fourth mask 147a, thereby exposing the passive layer 130a and the protection layer 135a covering the passive layer 130a. Next, a layer 155 for a non-doped clad layer and for a first blocking layer is selectively formed at a portion of the resultant structure that is not covered with the fourth mask 147a, so that a passive waveguide is formed. Preferably, the layer 155 for a non-doped clad layer and for a first current confinement layer may be formed of non-doped InP. Then, a p-type second current confinement layer 160 and an n-type third current confinement layer 165 are sequentially grown on the resultant structure, thereby completing BRS type current confinement layers 155, 160 and 165. Preferably, the layer 155 for a non-doped clad layer and for a first current confinement layer is formed to a thickness of 1.5–2.0 $\mu$m, and the second current confinement layer 160 and the third current confinement layer 165 are respectively formed to a thickness of 0.3 $\mu$m.

Here, the p-type second current confinement layer 160 and the n-type third current confinement layer 165 help injected current flow through the active layer 120b. If Fe is added when growing the layer 155 for a non-doped clad layer and for a first current confinement layer, current can be effectively confined.

A non-doped InP functions as a current confinement layer around the active layer 120b as shown in FIG. 2I, whereas it is formed as a clad layer of a passive waveguide around the passive layer 130a as shown in FIG. 2J. Thus, it is possible to reduce an optical loss in a passive waveguide by forming a non-doped clad layer around a passive layer.

Figure 2K:
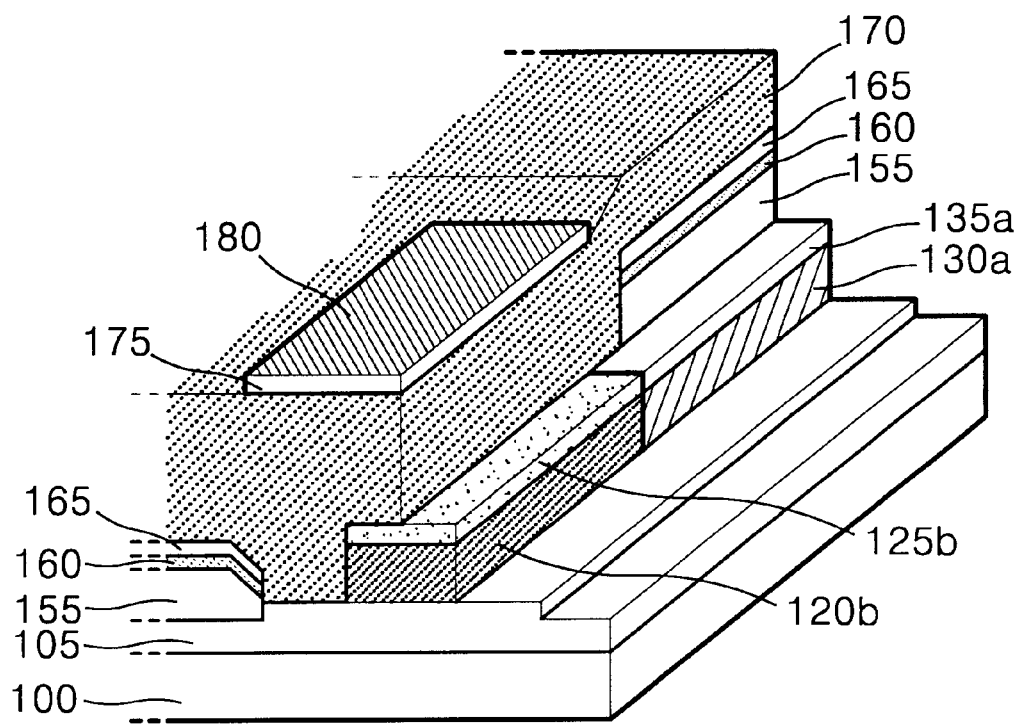

Referring to FIG. 2K, the fourth mask 147a is removed, and then a p-type current injection layer 170 is formed on the resultant structure having the third current confinement layer 165 so as to form an active waveguide which is to be combined with the passive waveguide. Next, an InGaAs layer for an electrode is grown on the resultant structure. Thereafter, the greater part of the InGaAs layer is removed by a lithography process or selective wet etching, thereby remaining an InGaAs layer 175 on the active layer 120b. Then a metal layer 180, which is used for the injection of electric current, is deposited on the resultant structure and then heated, thereby completing a monolithic integrated semiconductor photonic device in which the active waveguide and the passive waveguide are combined with each other. In this semiconductor photonic device, an optical loss is diminished. Further, expensive equipment such as an ion implanter is not necessary, thereby decreasing manufacturing costs therefor.

Figure 3A:
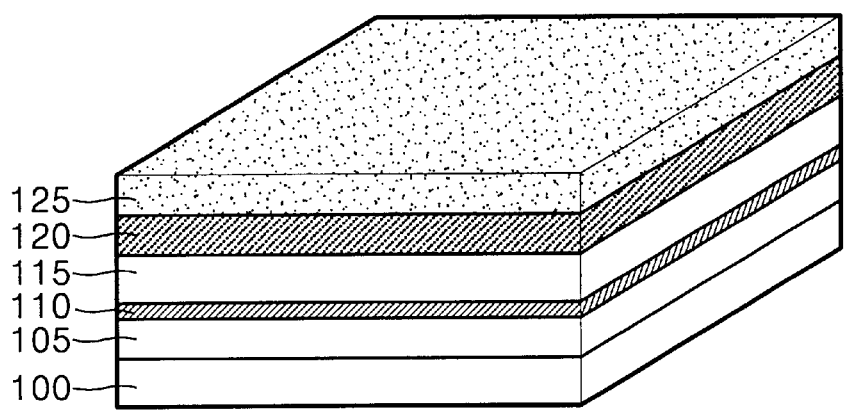
FIGS. 3A through 3K are perspective and cross-sectional views explaining a second embodiment of a method of fabricating a monolithic integrated semiconductor photonic device according to the present invention.
Figure 3B:
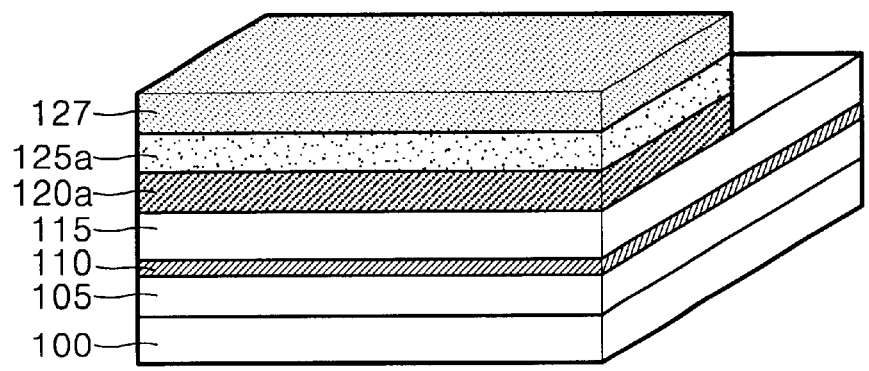
Figure 3C:
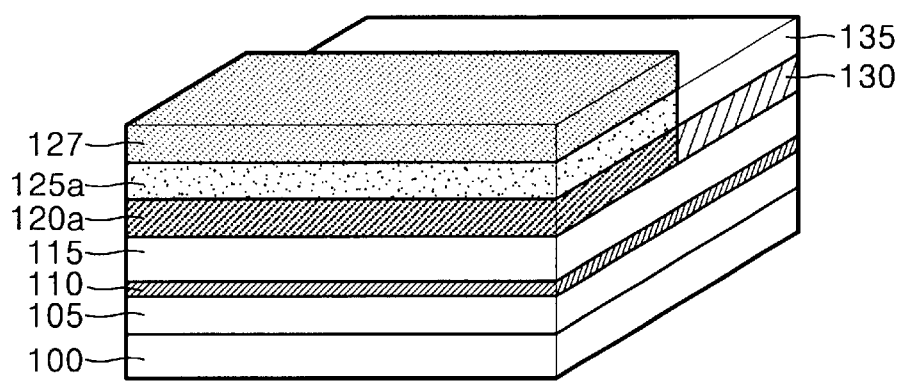
Figure 3D:
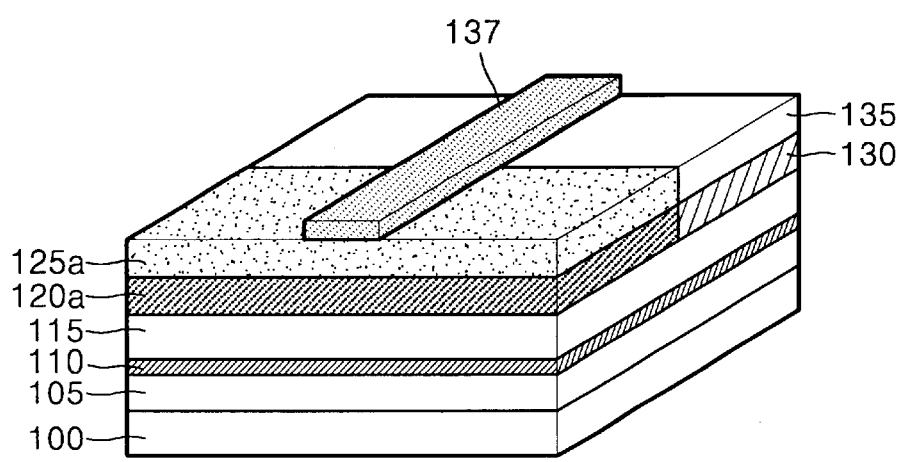
Figure 3E:
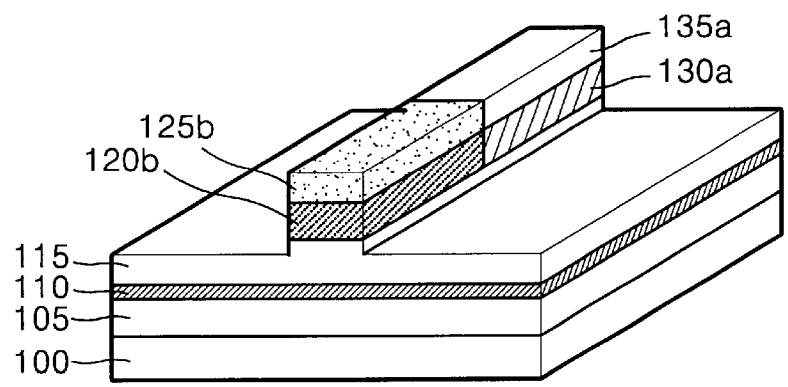
Figure 3F:
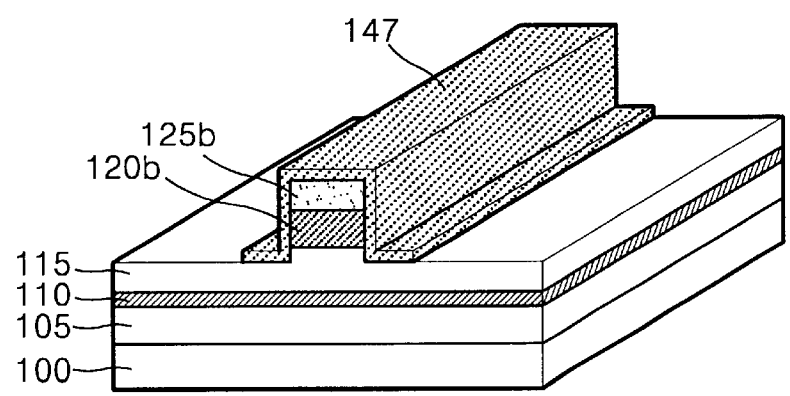
Figure 3G:
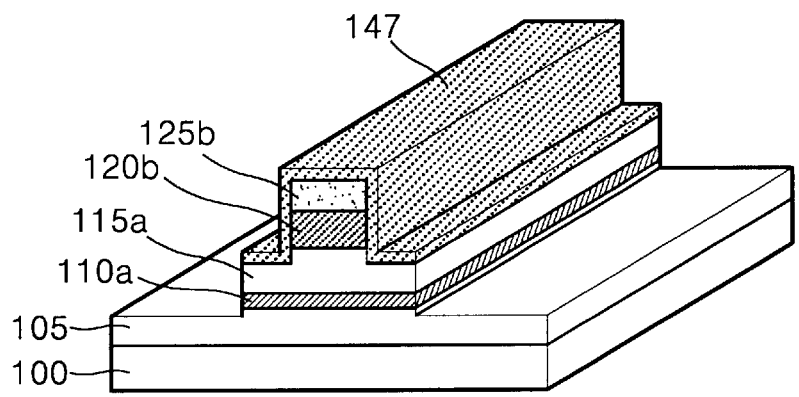
Figure 3H:
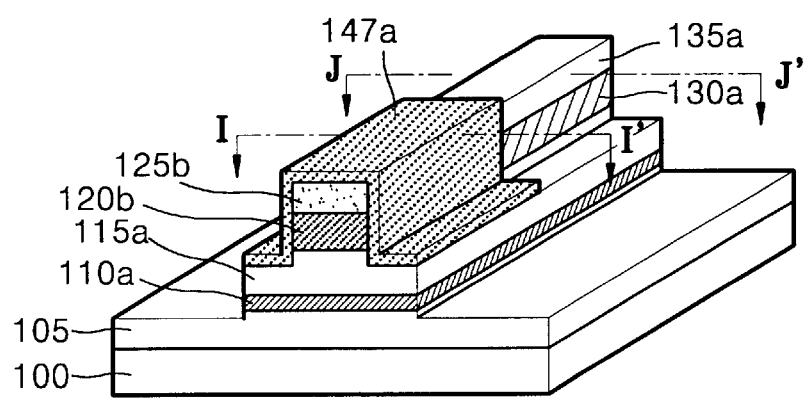
Figure 3I:
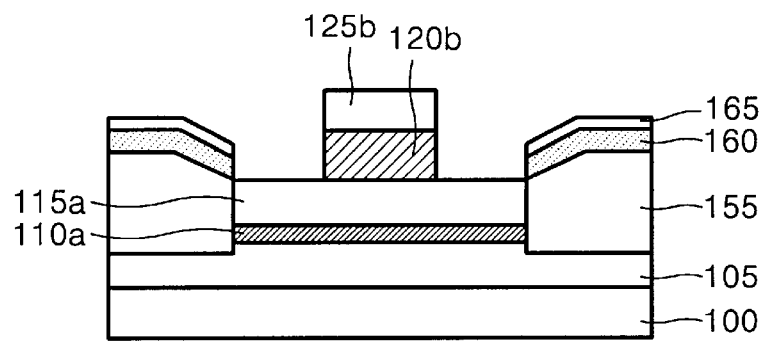
Figure 3J:
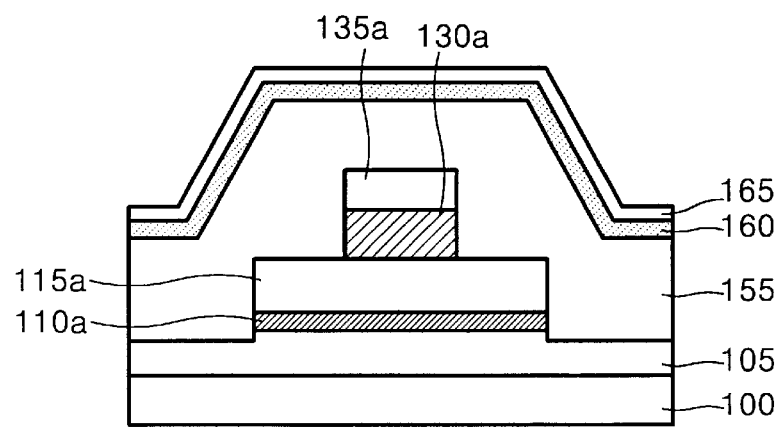

Next, referring to FIGS. 3A through 3K are views explaining a second embodiment of a method of fabricating a monolithic integrated semiconductor photonic device according to the present invention. In detail, FIG. 3I is a cross-sectional view of the resultant structure of FIG. 3H, taken along the line I–I', and FIG. 3J is a cross-sectional view of the resultant structure of FIG. 3H, taken along the line J–J'.

In this embodiment, a semiconductor photonic device that is integrated with a mode-conversion waveguide will be described with reference to FIGS. 3A through 3K.

Referring to FIG. 3A, an n-type buffer layer 105, a mode-conversion passive layer 110, a space layer 115, a first layer 120 for an active layer, and a first protection layer 125 are sequentially grown on an n-type semiconductor substrate 100. These layers may be formed by MOCVD, and the first layer 120 for an active layer may be formed of, for example, bulk InGaAsP, MQW, bulk InGaAsP containing SCH or MQW containing SCH. The first protection layer 125 is formed of InP that is doped with a p-type carrier, so as to inject electric current into an active layer.

Meanwhile, the mode-conversion passive layer 110 is a layer that is used to increase the coupling efficiency between the mode-conversion passive layer 110 and optical fiber, and is preferably formed of InGaAsP having low refractive index and a large energy band gap in order to reduce a constraint force given on progressive light. Also, preferably, the space layer 115 is formed of an n-type doped InP for the formation of a p-n contacting surface in an active layer. Preferably, the density of the doped space layer 115 is determined in a range from $5\times10^{17}$ cm$^{-1}$ to $1\times10^{18}$ cm$^{-1}$, and the space layer 115 is formed to a thickness of 0.3–0.6 μm.

Then, as shown in FIG. 3B, a first mask 127 is formed on the first protection layer 125, and then portions of the first protection layer 125 and the first layer 120 for an active layer are removed by dry etching or wet etching, using the first mask 127 as an etch mask. As a result, a portion of the top of the space layer 115 is exposed to form a first protection layer pattern 125a and a first pattern 120a for an active layer.

As can be seen from FIG. 3C, a second layer 130 for a passive layer is selectively grown on the exposed portion of the space layer 115 which is not covered with the first mask 127. At this time, the second layer 130 for a passive layer is in contact with a sidewall of the first pattern 120a for an active layer. Preferably, the second layer 130 for a passive layer is formed of bulk InGaAsP or MWQ. Thereafter, a second protection layer 135 is grown on the second layer 130 for a passive layer. Here, preferably, the second layer for a passive layer is formed of InGaAsP having a larger energy band gap than progressive light, and the second protection layer 135 is formed of non-doped InP so as to reduce a loss in light propagating into a waveguide.

Then, referring to FIG. 3D, the first mask 127 is removed, and then a second strip-type mask 137 is formed on the first protection layer pattern 125a and the second protection layer 135, thereby forming an active layer, a protection layer above the active layer, a passive layer connected directly to the active layer, and a protection layer above the passive layer together in the form of a strip.

Referring to FIG. 3E, the first protection layer pattern 125a, the second protection layer 135, the first pattern 120a for an active layer, and the second layer 130 for a passive layer are dry etched using the second mask 137. Accordingly, an active layer 120b, a protection layer 125b above the active layer 120b, a passive layer 130a connected directly to the active layer 120b, and a protection layer 135a above the passive layer 130a are formed in the shape of a strip. If dry etching is used during this process, wet etching may follow the dry etching so as to remove remains of the removed layers.

In general, to increase the coupling efficiency between a mode conversion waveguide layer and an optical fiber, the mode conversion waveguide layer is formed to be wider than the active layer 120b and the passive layer 130a, which are formed to a width of 0.5–1.5 μm for the formation of a monolithic mode. Thus, as shown in FIG. 3F, a third mask 147 is formed to cover the active layer 120b, the protection layer 125b, the passive layer 130a, and the protection layer 135a. Based on the above condition, the third mask 147 must be formed to be wider than the active layer 120b and the passive layer 130a, preferably, to a width of 3–8 μm.

Next, as shown in FIG. 3G, the space layer 115 and the mode-conversion passive layer 110 are dry etched or wet etched with the third mask 147 as an etch mask so that a portion of the top of the buffer layer 105 can be exposed, thereby obtaining mode-conversion waveguide layers 110a and 115a. At this time, preferably, a portion of the exposed buffer layer 105 is etched, which makes a current confinement layer be properly formed during a subsequent process. Preferably, the buffer layer 105 is etched to a depth of 2 μm.

Then, referring to FIGS. 3H through 3J, the third mask 147, which was used to form the mode-conversion waveguide layers 110a and 115a, is patterned to form a fourth mask 147a, so that the passive layer 110a and the protection layer 135a are exposed. Thereafter, in order to form a passive waveguide, the layer 155 for the non-doped clad layer and for the first current confinement layer is selectively formed on the portions of the resultant structure that are not covered with the fourth mask 147a. The layer 155 for the non-doped clad layer and for the first current confinement layer may be formed of non-doped InP, for example. Next, a p-type second current confinement layer 160 and an n-type third current confinement layer 165 are sequentially grown on the layer 155 for the non-doped clad layer and for the first current confinement layer. Preferably, the layer 155 for the non-doped clad layer and the first current confinement layer is formed to a thickness of 1.5–2.0 μm, and the second and third current confinement layers 160 and 165 are formed to a thickness of about 0.3 μm, respectively.

Accordingly, BRS type current confinement layers 155, 160 and 165 are obtained. Here, the p-type second current confinement layer 160 and the n-type third current confinement layer 165 help injected current flow through the active layer 120b. If Fe is added when growing the layer 155 for the non-doped clad layer and for first current confinement layer, electric current can be more effectively blocked.

The non-doped InP functions as a current confinement layer around the active layer 120b in FIG. 3I, whereas the non-doped InP is formed as a non-doped clad layer for a passive waveguide around the passive layer 130a in FIG. 3J. Thus, it is possible to reduce an optical loss in a passive waveguide by forming a non-doped clad layer around a passive layer.

Figure 3K:
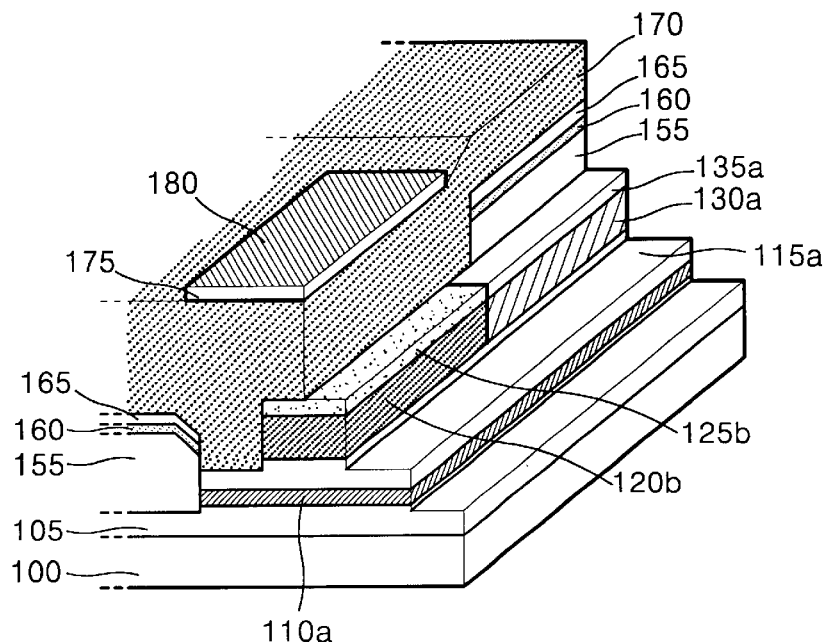

Referring to FIG. 3K, the fourth mask 147a is removed, and then a p-type current injection layer 170 is formed on the resultant structure having the third current confinement layer 165 so as to form an active waveguide which is to be coupled with the passive waveguide. Then, an InGaAs layer 175 for an electrode is grown. Next, the greater part of the InGaAs layer 175 is removed by a lithography process or selective wet etching so as to remain only on the active layer 120b. Thereafter, a metal layer 180, which is used to the injection of current, is deposited and heated on the remnant InGaAs layer 175, thereby obtaining a semiconductor photonic device that is integrated with the mode-conversion waveguide.

Figure 4:
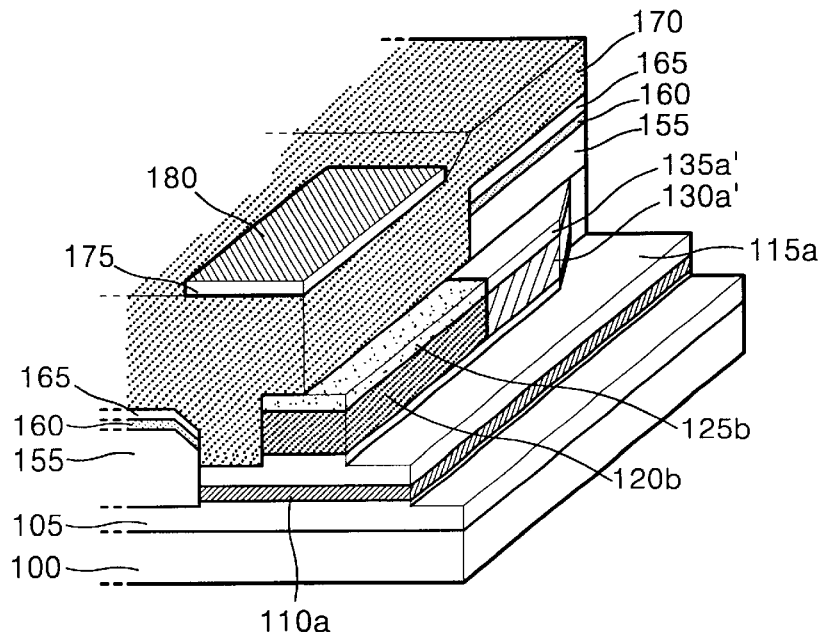
FIG. 4 is a perspective view of a third embodiment of a monolithic integrated semiconductor photonic device coupled with a mode converter.

FIG. 4 is a perspective view of a third embodiment of a monolithic integrated semiconductor photonic device coupled with a mode converter. Here, the mode converter is formed by tapering off an outlet or inlet of a passive layer 130a' from a predetermined point, gradually increasing a waveguide mode, and transferring the waveguide mode to mode-conversion waveguide layers 110a and 115a positioned below the passive layer 130a. Here, the passive layer 130a' and a protection layer 135' above the passive layer 130a' are formed as a strip, and their widths are same as that of the active layer 120b to a predetermined point, but their widths are tapering off to a 0.1 μm from the predetermined point.

While this invention has been particularly shown and described with reference to a preferred embodiment thereof, it will be understood by those skilled in the art that various changes in form and details may be made therein without departing from the spirit and scope of the invention as defined by the appended claims. For example, with a method of fabricating a monolithic integrated semiconductor photonic device, according to the present invention, it is possible to realize a variety of monolithic integrated photonic device such as a space switch, a wavelength converter, a distributed Bragg reflector (DBR) semiconductor laser, and a modulator.

From the above embodiments, it is noted that in the present invention, a non-doped clad layer substitutes for a p-type clad layer of conventional BRS structure, thereby minimizing an optical loss. Thus an active waveguide can be effectively coupled to the passive waveguide.

Further, in the present invention, a current confinement layer is formed of a non-doped layer, unlike in the conventional BRS structure adopting a current confinement layer made by ion implantation. Therefore, an expensive tool such as an ion implanter is not required.

Accordingly, with a method of fabricating a monolithic integrated semiconductor photonic device, a monolithic integrated semiconductor photonic device having excellent regularity and in which an optical loss can be minimized due to a non-doped clad layer.

What is claimed is:

1. A method of fabricating a monolithic integrated semiconductor photonic device which effectively combines an active waveguide and a passive waveguide, and minimizes an optical loss, the method comprising:

forming an active layer of a strip shape and a passive layer of a strip shape, which is connected directly to the active layer, on a first conductive substrate;

forming a non-doped clad layer around the passive layer so as to form a passive waveguide, and a buried ridge strip (BRS) type current confinement layer around the active layer without ion injection; and forming a second conductive current injection layer on the resultant structure having the current confinement layer so as to form an active waveguide coupled to the passive waveguide;

wherein forming the active layer and the passive layer comprises:

sequentially growing a first conductive buffer layer, a first layer for the active layer, and a first protection layer of a second conductive type on the substrate;

etching the first protection layer and the first layer for the active layer so as to expose a portion of the top of the buffer layer;

selectively growing a second layer for the passive layer to be in contact with a sidewall of the first layer for the active layer on the exposed portion of the buffer layer, and then forming a non-doped second protection layer on the second layer for the passive layer; and etching the first protection layer, the second protection layer, the first layer for the active layer, and the second layer for the passive layer, so that a portion of the top of the buffer layer is exposed, and then, an active layer, a protection layer above the active layer, a passive layer, and a protection layer above the passive layer are formed in the shape of a strip having a regular width;

wherein the forming the non-doped clad layer and the BRS type current confinement layer comprises:

forming a first mask for covering the active layer, the protection layer above the active layer, the passive layer, and the protection layer above the passive layer, the first mask having wider width than the active layer and the passive layer;

etching a portion of the buffer layer with the first mask as an etch mask;

forming a second mask by patterning the first mask so as to expose the sidewall of the passive layer and the protection layer above the passive layer;

selectively forming a layer for the non-doped clad layer and first current confinement layer on the portions of the resultant structure that are not covered with the second mask;

sequentially growing a second current confinement layer of a second conductive type, a third current confinement layer of a first conductive type on the layer for the non-doped clad layer and first current confinement layer; and removing the second mask.

2. The method of claim 1, wherein during etching a portion of the buffer layer, the portion of the buffer layer is etched to a depth of about 2 μm.

3. The method of claim 1, wherein the active layer comprises bulk InGaAsP, multi quantum well (MQW), bulk InGaAp containing separate confinement heterostructure (SCH), or MQW containing SCH.

4. The method of claim 1, wherein the passive layer comprises bulk InGaAsP or MQW.

5. The method of claim 1, wherein the layer for the non-doped clad layer and for first current confinement layer comprises a non-doped InP.

6. The method of claim 1, wherein the layer for the non-doped clad layer and for first current confinement layer comprises InP containing Fe.

7. The method of claim 1, wherein the layer for the non-doped clad layer and for first current confinement layer is formed to a thickness of 1.5–2.0 μm, and the second and third current confinement layers are formed to a thickness of about 0.3 μm.

8. The method of claim 1, wherein the current confinement layer is a three-layered layer of a non-doped InP, InP of a second conductive type, and InP of a first conductive type.

9. The method of claim 8, wherein the non-doped InP is formed to a thickness of 1.5–2.0 μm, and the InP of a second conductive type and the InP of a first conductive type are formed to a thickness of about 0.3 2 μm respectively.

10. A method of fabricating a monolithic integrated semiconductor photonic device that is integrated with a mode-conversion waveguide, and effectively combines an active waveguide and a passive waveguide, and is capable of minimizes an optical loss in light propagating into these waveguides, the method comprising:

sequentially growing a first conductive buffer layer, a mode-conversion passive layer, a first conductive space layer, a first layer for an active layer, and a first protection layer of a second conductive type on a first conductive substrate;

etching the first protection layer and the first layer for an active layer so as to expose a portion of the top of the space layer;

selectively growing a second layer for a passive layer in contact with the sidewall of the first layer for an active layer on the exposed portion of the space layer, and then growing a second non-doped protection layer on the second layer for a passive layer;

etching the first protection layer, the second protection layer, the first layer for an active layer, and the second layer for a passive layer, so that a portion of the top of the space layer is exposed, and then, an active layer, a protection layer above the active layer, a passive layer that is coupled directly to the active layer, and a protection layer above the passive layer are formed in the shape of a strip;

forming a first mask for covering the active layer, the protection layer above the active layer, the passive layer, and the protection layer above the passive layer, the first mask having wider width than the active layer and the passive layer;

etching a portion of the exposed buffer layer with the first mask as an etch mask while etching the space layer and the mode-conversion passive layer, so as to expose a portion of the top of the buffer layer;

forming a second mask by patterning the first mask so as to expose the passive layer coupled directly to the active layer and the protection layer above the passive layer;

selectively forming a layer for a non-doped clad layer and for first current confinement layer on the portion of the resultant structure that is not covered with the second mask, so as to form a passive waveguide;

sequentially growing a second current confinement layer of a second conductive type and a third current confinement layer of a first conductive type on the layer for the non-doped clad layer and for a first current confinement layer;

and removing the second mask, and forming a current injection layer of a second conductive type on the resultant structure having the third current confinement layer, so as to form an active waveguide coupled with the passive waveguide.

11. The method of claim 10, wherein the active layer comprises bulk InGaAsP, MQW, bulk InGaAsP containing a separate confinement heterostructure (SCH), or MOW containing SCH.

12. The method of claim 10, wherein the passive layer coupled directly with the active layer comprises bulk InGaAsP or MOW.

13. The method of claim 10, wherein the mode-conversion passive layer comprises InGaAsP having larger band gap than the passive layer coupled directly to the active layer.

14. The method of claim 10, wherein the layer for the non-doped clad layer and for first current confinement layer comprises the non-doped InP.

15. The method of claim 10, wherein the layer for the non-doped clad layer and for first current confinement layer comprises InP containing Fe.

16. The method of claim 10, wherein the second and third current confinement layers comprise mR1 respectively.

17. The method of claim 10, wherein the layer for the non-doped clad layer and for first current confinement layer are formed to a thickness of 1.5–2.0 2 $\mu$m, and the second and third current confinement layers are each formed to a thickness of about 0.3 $\mu$m.

18. The method of claim 10, wherein the density of the doping concentration of the space layer is in the range from $5 \times 10^{17}$ cm$^{-1}$ to $1 \times 10^{18}$ cm$^{-1}$.

19. The method of claim 10, wherein the space layer is formed to a thickness of 0.3–0.6 $\mu$m.

20. The method of claim 10, wherein during etching the first protection layer, the second protection layer, the first layer for the active layer, and a second layer for the passive layer, the active layer, the protection layer above the active layer, the passive layer that is coupled directly to the active layer, and the protection layer above the passive layer are formed in the shape of a strip having a regular width.

21. The method of claim 10, wherein during etching the first protection layer, the second protection layer, the first layer for the active layer, and a second layer for the passive layer, the active layer and the protection above the active layer are each formed as a strip of regular width, and the passive layer that is coupled directly to the active layer and the protection layer above the passive layer are formed to have the same width as the active layer to a predetermined point and their widths are tapering off to 0.1 $\mu$m from the predetermined point.

22. The method of claim 10, wherein portions of the space layer and the mode-conversion passive layer are etched until the widths thereof are 3–8 $\mu$m.

23. The method of claim 10, wherein the portion of the buffer layer is etched to a depth of about 2 $\mu$m when a portion of the exposed buffer layer is etched while etching the space layer and the mode-conversion passive layer.

* * * * *